(12) United States Patent
Park

(10) Patent No.: US 8,500,905 B2
(45) Date of Patent: Aug. 6, 2013

(54) KYROPOULOS SAPPHIRE SINGLE CRYSTAL GROWING APPARATUS USING ELLIPTIC CRUCIBLE

(75) Inventor: Jong Kwan Park, Osan (KR)

(73) Assignee: DK Aztec Co., Ltd., Ansung (KR)

( * ) Notice: Subject to any disclaimer, the term of this patent is extended or adjusted under 35 U.S.C. 154(b) by 0 days.

(21) Appl. No.: 13/344,498

(22) Filed: Jan. 5, 2012

(65) Prior Publication Data

US 2012/0186513 A1    Jul. 26, 2012

(30) Foreign Application Priority Data

Jan. 26, 2011  (KR) ........................ 10-2011-0007765

(51) Int. Cl.
| | |
|---|---|
| C30B 17/00 | (2006.01) |
| C30B 15/00 | (2006.01) |
| C30B 9/00 | (2006.01) |
| C30B 21/06 | (2006.01) |
| C30B 27/02 | (2006.01) |
| C30B 28/10 | (2006.01) |
| C30B 11/00 | (2006.01) |
| C30B 28/06 | (2006.01) |
| C30B 35/00 | (2006.01) |
| C30B 29/20 | (2006.01) |

(52) U.S. Cl.
CPC ................ *C30B 17/00* (2013.01); *C30B 15/00* (2013.01); *C30B 9/00* (2013.01); *C30B 21/06* (2013.01); *C30B 27/02* (2013.01); *C30B 28/10* (2013.01); *C30B 11/00* (2013.01); *C30B 28/06* (2013.01); *C30B 35/00* (2013.01); *C30B 29/20* (2013.01)
USPC .............. 117/217; 117/73; 117/208; 117/23; 117/81; 117/200; 117/223; 117/950

(58) Field of Classification Search
CPC .................................. C30B 15/00; C30B 17/00
USPC .............. 117/217, 208, 23, 73, 81, 200, 223, 117/950
See application file for complete search history.

(56) References Cited

FOREIGN PATENT DOCUMENTS

JP    07206584 A  *  8/1995

OTHER PUBLICATIONS

"Evolution of the sapphire industry: Rubicon Technology and Gavish". Daniel C. Harris, Proc. of SPIE vol. 7302 730202, 2009.*

* cited by examiner

*Primary Examiner* — Michael Kornakov
*Assistant Examiner* — Hua Qi

(57) ABSTRACT

Disclosed is a sapphire single crystal growing apparatus using the Kyropoulos method, and more particularly, is a Kyropoulos sapphire single crystal growing apparatus using an elliptic crucible, which can increase the recovery rate by the elliptic crucible and anisotropic heating.

4 Claims, 2 Drawing Sheets

KYROPOULOS SAPPHIRE SINGLE CRYSTAL GROWING APPARATUS USING ELLIPTIC CRUCIBLE

BACKGROUND OF THE INVENTION

1. Field of the Invention

The present invention relates to a sapphire single crystal growing apparatus using the Kyropoulos method, and more particularly, to a Kyropoulos sapphire single crystal growing apparatus using an elliptic crucible, which can increase the recovery rate by the elliptic crucible and anisotropic heating.

2. Description of the Related Art

A sapphire single crystal substrate is an alternative substrate for gallium nitride (GaN), and is used as basic elements, including data storage devices, such as a blue or green light emitting diode (LED), a blue laser diode (LD), a DVD, etc., and various optical devices, such as a white light emitting device, a photo-detectors (PD), etc. In addition, a sapphire single crystal is an a-alumina single crystal, and is also used as biomaterial for artificial joints, artificial tooth, etc because causing no harm to human bodies.

However, since sapphire is an a-alumina single crystal having a rhombohedral structure, the sapphire has the optical and thermal anisotropy. Therefore, it is impossible to make an ingot from a sapphire polycrystal and, although possible, it is impossible to obtain a superior property, so that it is urgently required to develop a method of economically growing a sapphire single crystal.

Until now, the Czochralski method, the Edge-defined Film-fed Growth (EFG) method, the heat exchanging method, the Kyropoulos method, etc. have been known as the growth methods which make it possible to obtain such a sapphire single crystal.

The Czochralski method is called a rotation pulling method, which is to bring a seed crystal into contact with the surface of alumina solution and then to grow a single crystal by rotation pulling. Such a growth method makes it possible to produce a single crystal having a relatively high etch pit density (EPD), but limits the shape of the single crystal to a cylinder shape. Also, in the case of using the growth method, a vibration caused by the puller or shaking in the crucible may cause a defect in a crystal, and a high temperature gradient may cause a crack on a crystal when the crystal has a diameter of 5 cm or more.

The EFG method, which is intended to solve the defect of the Czochralski method, is to grow a single crystal with a desired shape in such a manner as to deposit a molybdenum die with the desired shape in alumina solution, to bring a seed crystal into contact with melted alumina rising to the surface of the die due to surface tension, and then to pull up. This method also does not make it possible to lower the defect density.

The heat exchanging method is to grow a single crystal in such a manner as to install a heat exchanger on the lower part of a growth furnace having a uniform temperature, and to precisely control the amount of flow of helium gas passing through the heat exchanger and the temperature of a heating element (e.g. heater). The growth method does not require a crucible to move a crystal itself, and thus it is possible to obtain a single crystal of good quality. However, since helium gas used as a heat exchange medium is high-priced, there is a fatal defect in that production costs are high.

The Kyropoulos method is similar to the Czochralski method, but does not rotate a single crystal and performs only a little pulling to grow the single crystal. This growth method has advantages in that a grown crystal has a few defects, the growth of a large-sized crystal is possible, and the equipment costs thereof are lower than those of the Czochralski method. Recently, it has been known that 60% of produced sapphire single crystals have been grown in the Kyropoulos method.

However, the Kyropoulos method has a disadvantage in that the recovery rate is low. That is to say, a sapphire single crystal substrate for deposition of GaN thin film generally requires a c-plane, while a sapphire crystal by the Kyropoulos method has a characteristic that the growth rate of a-plane is two or more times faster than the growth rate of c-plane. Therefore, there is an inconvenience in that an ingot grown into an a-plane has to be processed into a c-plane, which process is called "core drilling".

In addition, since the Kyropoulos uses a cylindrical crucible, a grown crystal also has a cylindrical shape. Therefore, the cylindrical crystals are disadvantageous in terns of the cylinder recovery rate in comparison with rectangular block-type crystals. Moreover, the Kyropoulos method has a problem in that, when the diameter is raised, a crystal extension region is formed and the region is not used for good cylinders.

SUMMARY OF THE INVENTION

Accordingly, the present invention has been made in an effort to solve the problems occurring in the related art, and an object of the present invention is to provide a Kyropoulos sapphire single crystal growing apparatus using an elliptic crucible, which can grow an elliptic ingot for a cylindrical ingot in order to improve a low recovery rate of the Kyropoulos method.

In order to achieve the above object, according to one aspect of the present invention, there is provided a Kyropoulos sapphire single crystal growing apparatus using an elliptic crucible, the apparatus comprising: a chamber configured to be filled with heat-insulating material; a heating element configured to be fixedly installed inside the heat-insulating material; an elliptic crucible configured to be located inside the heating element, to accommodate raw material of sapphire single crystals, and to have a horizontal cross section of an elliptic shape; a support member configured to prevent the crucible from drooping down due to a weight of accommodated material; and a stand configured to be located on an upper end of the support member to allow the crucible to be put on the stand.

Preferably, in the crucible having a horizontal cross section of an elliptic shape, a ratio of a short axis of the ellipse to a long axis thereof is 20% or less.

In addition, a seed crystal is put such that the horizontal direction of a C-axis is put in a long-axis direction of the ellipse, and the vertical direction of the C-axis is put in a short-axis direction of the ellipse.

In addition, the heating element is divided into a short-axis heating element located outside the crucible in the short-axis direction, and a long-axis heating element located outside the crucible in the long-axis direction.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
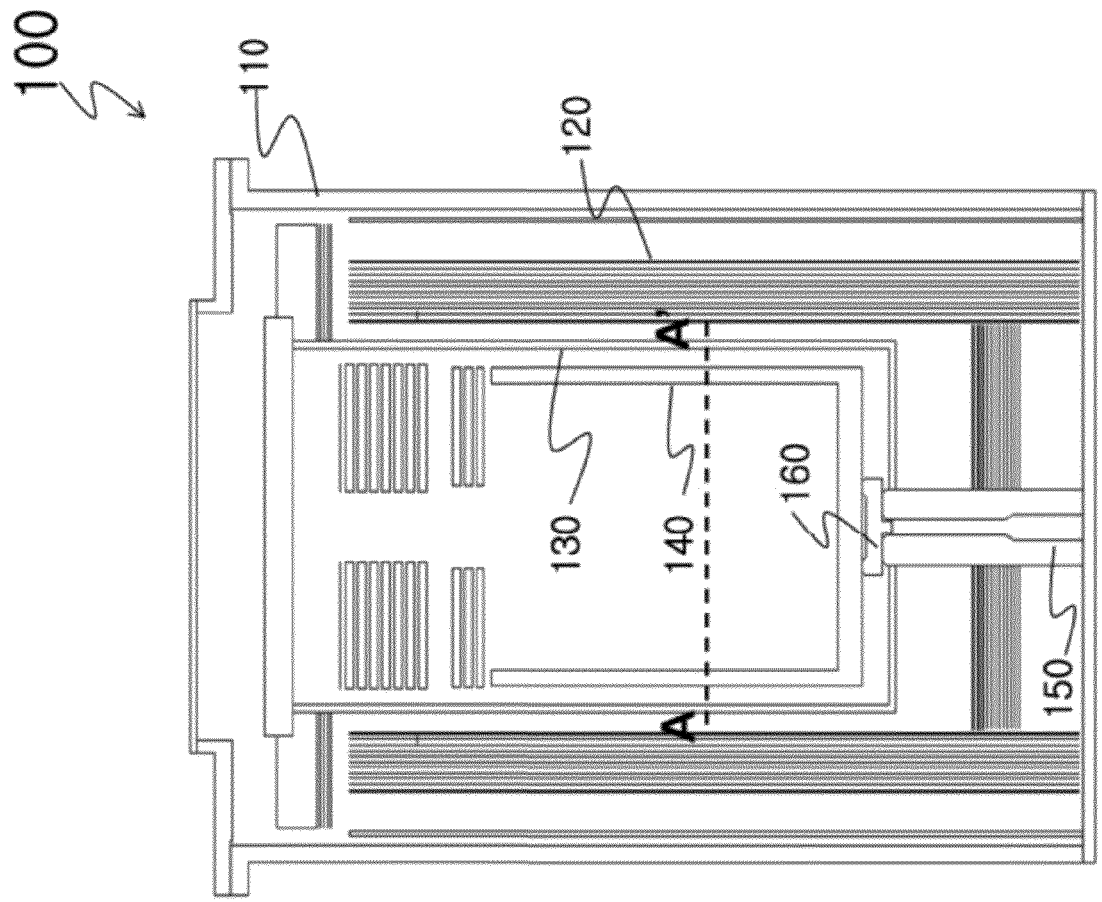
FIG. 1 is a cross-sectional view of a Kyropoulos sapphire single crystal growing apparatus using an elliptic crucible according to an embodiment of the present invention.

Reference will now be made in greater detail to a preferred embodiment of the invention, an example of which is illustrated in the accompanying drawings. Wherever possible, the same reference numerals will be used throughout the drawings and the description to refer to the same or like parts.

FIG. 1 is a cross-sectional view of a Kyropoulos sapphire single crystal growing apparatus using an elliptic crucible according to an embodiment of the present invention.

Referring to FIG. 1, the Kyropoulos sapphire single crystal growing apparatus 100 using an elliptic crucible includes a chamber 110 configured to be filled with heat-insulating material 120, a heating element 130 configured to be fixedly installed inside the heat-insulating material, an elliptic crucible 140 configured to be located inside the heating element, to accommodate raw material of sapphire single crystals, and to have a horizontal cross section of an elliptic shape, a support member 150 configured to prevent the crucible from drooping down due to the weight of accommodated material, and a stand 160 configured to be located on an upper end of the support member to allow the crucible to be put on the stand 160.

The Kyropoulos sapphire single crystal growing apparatus 100 using an elliptic crucible according to an embodiment of the present invention utilizes the specific characteristic of a sapphire single crystal in order to improve the low recovery rate, which is a defect of the Kyropoulos method.

Generally, a sapphire single crystal has a feature that the crystal growth rate in the C-axis horizontal direction (i.e. C-surface direction) is lower by about 20% than that in the C-axis vertical direction (i.e. C-surface vertical direction). For this reason, the sapphire single crystal growing apparatus 100 according to an embodiment of the present invention performs a crystal growth in the C-axis horizontal direction at a lower rate, while performing a crystal growth in the C-axis vertical direction at a higher rate, thereby fabricating an elliptic ingot, not a cylindrical ingot. Such an elliptic ingot brings an improvement in a recovery rate when being processed into a cylinder.

To this end, the crucible 140 in the sapphire single crystal growing apparatus according to an embodiment of the present invention has an elliptic shape. That is to say, the crucible is manufactured to have a horizontal cross section of an elliptic shape so that an elliptic ingot can be manufactured.

Figure 2:
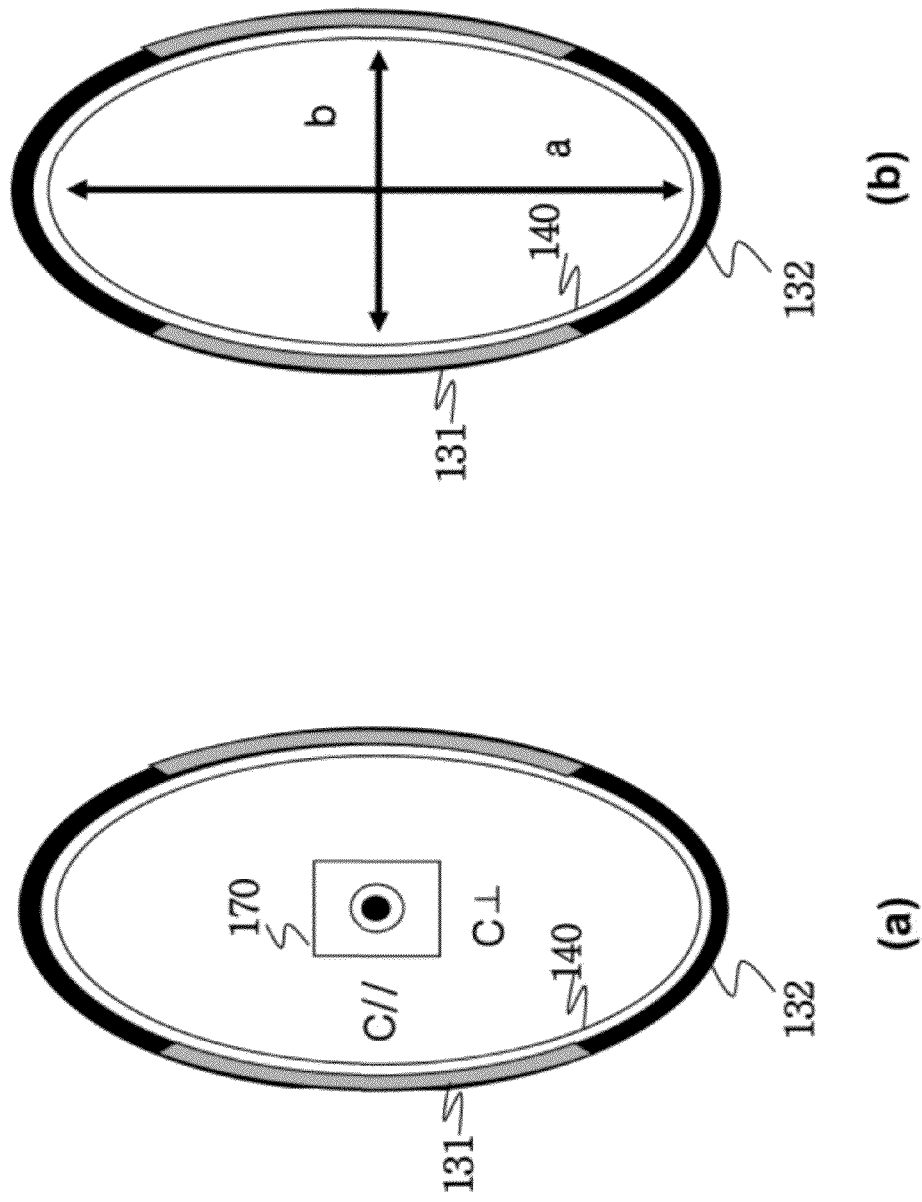
FIG. 2 is a cross sectional view of a part, which is taken along line A-A', in the Kyropoulos sapphire single crystal growing apparatus using an elliptic crucible according to an embodiment of the present invention.

FIG. 2 is a cross sectional view of a part, which is taken along line A-A', in the Kyropoulos sapphire single crystal growing apparatus using an elliptic crucible according to an embodiment of the present invention.

As shown in FIG. 2, the crucible in the sapphire single crystal growing apparatus according to an embodiment of the present invention has a horizontal cross section of an elliptic shape. Generally, an ellipse is defined as the locus of all points that have equal sum of distances from two focal points.

In addition, the line segment connecting two points that are spaced by an equal distance from the two focal points is called a short axis "b", and the line segment connecting two points that have a maximum distance difference from the two focal points is called a long axis "a".

It goes without saying that the elliptic shape in the present invention includes not only a geometrically perfect ellipse described above, but also shapes in which a short axis and a long axis can be distinguished from each other, except for perfect circles.

In this case, as shown in FIG. 2(a), a seed crystal is set such that the horizontal direction of the C-axis thereof faces the short axis "b" of the ellipse, and the vertical direction of the C-axis faces the long axis "a" of the ellipse. Through this, the growth in the horizontal direction of the C-axis is restricted by the short axis of the ellipse, and the growth in the vertical direction of the C-axis can be further promoted by the long axis of the ellipse. Preferably, when a seed crystal is set to the axes of the ellipse, an error angel exceeding one degree)(1° with respect to each axis should not be caused.

In addition, when the crucible is manufactured in an elliptic shape, the ratio "b/a" of the short axis "b" of the ellipse to the long axis "a" thereof is established to be equal to or less than 20%. Preferably, the ratio is established to be 20%. This is because, as described above, when a seed crystal is such that the horizontal direction of the C-axis thereof faces the short axis "b" of the ellipse, and the vertical direction of the C-axis faces the long axis "a" of the ellipse, and is grown, the crystal growth rate in the C-axis horizontal direction is lower by about 20% than that in the C-axis vertical direction. Therefore, a crucible shape having a ratio greater than the 20% causes a reduction in the effect thereof.

Also, in the sapphire single crystal growing apparatus according to an embodiment of the present invention, the heating element located outside the crucible is manufactured in an asymmetric shape, as shown in FIG. 2(b). In an embodiment, the heating element may include a short-axis heating element and a long-axis heating element. In an embodiment, the short-axis heating element may provide a higher heat than the long-axis heating element.

That is to say, a heating element located in the C-axis horizontal direction of the sapphire single crystal, i.e. in the short-axis direction "b" of the ellipse, is manufactured as the short-axis heating element 131 and may provide a relatively high heat in order to reduce the growth rate in the C-axis horizontal direction of the sapphire single crystal, i.e. in the short-axis direction "b" of the ellipse. The heating element located in the C-axis vertical direction of the sapphire single crystal, i.e. in the long-axis direction "a" of the ellipse, is manufactured as a long-axis heating element 132 providing a lower temperature than the short-axis heating element 131 in order to induce an increased growth rate in the C-axis vertical direction compared to the C-axis horizontal direction.

To this end, the short-axis heating element 131 located in the short-axis direction "b" of the elliptic crucible may be designed to use a multi-heater, to arrange heater rods at a close interval, or to use thick heater rods. In addition, two electrodes may be used to maintain a high temperature. In contrast, the long-axis heating element 132 located in the long-axis direction "a" of the elliptic crucible may be designed to use a single heater, to arrange heater rods at a wide interval, or to use thin heater rods. The aforementioned design for the short-axis heating element and the long-axis heating element is just an exemplary embodiment of the present invention, and those skilled in the art may make various changes in form and details without departing from the scope of the technical aspects of the invention.

In addition, the short-axis heating element may be designed to have the maximum temperature in the C-axis horizontal direction, i.e. in the short-axis direction of the ellipse, and to have a temperature gradually decreasing in the C-axis vertical direction, i.e. in the long-axis direction of the ellipse. Also, similarly, the long-axis heating element may be designed to have the minimum temperature in the C-axis vertical direction, i.e. in the long-axis direction of the ellipse, and to have a temperature gradually increasing in the C-axis horizontal direction, i.e. in the short-axis direction of the ellipse.

As is apparent from the above description, the present invention provides an apparatus which can overcome the defect of the Kyropoulos method in which the shape of a single crystal is limited to a cylindrical shape, thereby improving a low recovery rate.

According to the present invention, it is possible to secure the competitiveness of LED substrate material, and to preoccupy technology in a large scale field (corresponding to a 50 Kg or more class).

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A Kyropoulos sapphire single crystal growing apparatus using an elliptic crucible, the apparatus comprising:
   a chamber filled with heat-insulating material;
   a heating element fixedly installed inside the heat-insulating material;
   an elliptic crucible located inside the heating element, to accommodate raw material of sapphire single crystals, and having a horizontal cross section in an elliptic shape;
   a support member configured to prevent the crucible from drooping down due to a weight of the accommodated material; and
   a stand located on an upper end of the support member to allow the crucible to be put on the stand,
   wherein a seed crystal is positioned such that a horizontal direction of a C-axis is provided in a long-axis direction of the ellipse, and a vertical direction of the C-axis is provided in a short-axis direction of the ellipse, and
   wherein the heating element is divided into a short-axis heating element located outside the crucible in the short-axis direction, and a long-axis heating element located outside the crucible in the long-axis direction.

2. The apparatus according to claim 1, wherein, in the crucible having the horizontal cross section in the elliptic shape, a ratio of a short axis of the ellipse to a long axis thereof is 20% or less.

3. The apparatus according to claim 1, wherein the long-axis heating element uses a single heater and the short axis heating element uses a multi-heater.

4. The apparatus according to claim 1, wherein the short-axis heating element includes heater rods which are more densely arranged than those in the long-axis heating element.

* * * * *